United States Patent [19]

Baliga

[11] Patent Number: 4,506,282
[45] Date of Patent: Mar. 19, 1985

[54] NORMALLY-OFF SEMICONDUCTOR DEVICE WITH LOW ON RESISTANCE AND CIRCUIT ANALOGUE

[75] Inventor: Bantval J. Baliga, Clifton Park, N.Y.

[73] Assignee: General Electric Company, Schenectady, N.Y.

[21] Appl. No.: 455,174

[22] Filed: Jan. 3, 1983

[51] Int. Cl.[3] .................. H01L 29/72; H01L 29/80
[52] U.S. Cl. ................................ 357/43; 357/21; 357/22; 357/35; 307/570
[58] Field of Search .............. 357/43, 22, 35, 21; 307/570, 446, 254

[56] References Cited

PUBLICATIONS

J. Nishizawa et al., "Bipolar Mode Static Induction Transistor (BSIT)–High Speed Switching Device," *International Electron Devices Meeting*, 1978, pp. 676–679.
A. Caruso et al., "New Semiconductor Active Device: The Conductivity Controlled Transistor," *Electron Lett.*, vol. 15(1979), pp. 267–268.
B. J. Baliga, "Bipolar Operation of Power Junction Gate Field Effect Transistors," *Electron Lett.*, vol. 16(1980), pp. 300–301.
B. J. Baliga, "Silicon Power Field Control Device and Integrated Circuits," *Silicon Integrated Circuits—Part B*, D. Khang, editor, New York: Academic Press (1981), pp. 193–199.
Application Ser. No. 257,080, filed Apr. 24, 1981, by B. J. Baliga and M. S. Adler (GE Docket No. RD-13,176).

Primary Examiner—William D. Larkins
Assistant Examiner—Andrew Telesz
Attorney, Agent, or Firm—Charles E. Bruzga; James C. Davis, Jr.; Marvin Snyder

[57] ABSTRACT

A semiconductor device incorporates a JFET serially connected to a bipolar transistor to achieve normally-off operation. An impedance element is connected between the base of the bipolar transistor and the gate of the JFET, which serves as a single control electrode for the entire device. When a current is supplied to the control electrode, the bipolar transistor and JFET are both switched to the on state. In the JFET, the p-N junction between the gate region and the channel region is sufficiently forward-biased so as to inject current carriers into its channel region and markedly reduce the device on-resistance. An electrical circuit analogue of the device achieves the advantage of low on-resistance and normally-off operation.

11 Claims, 2 Drawing Figures

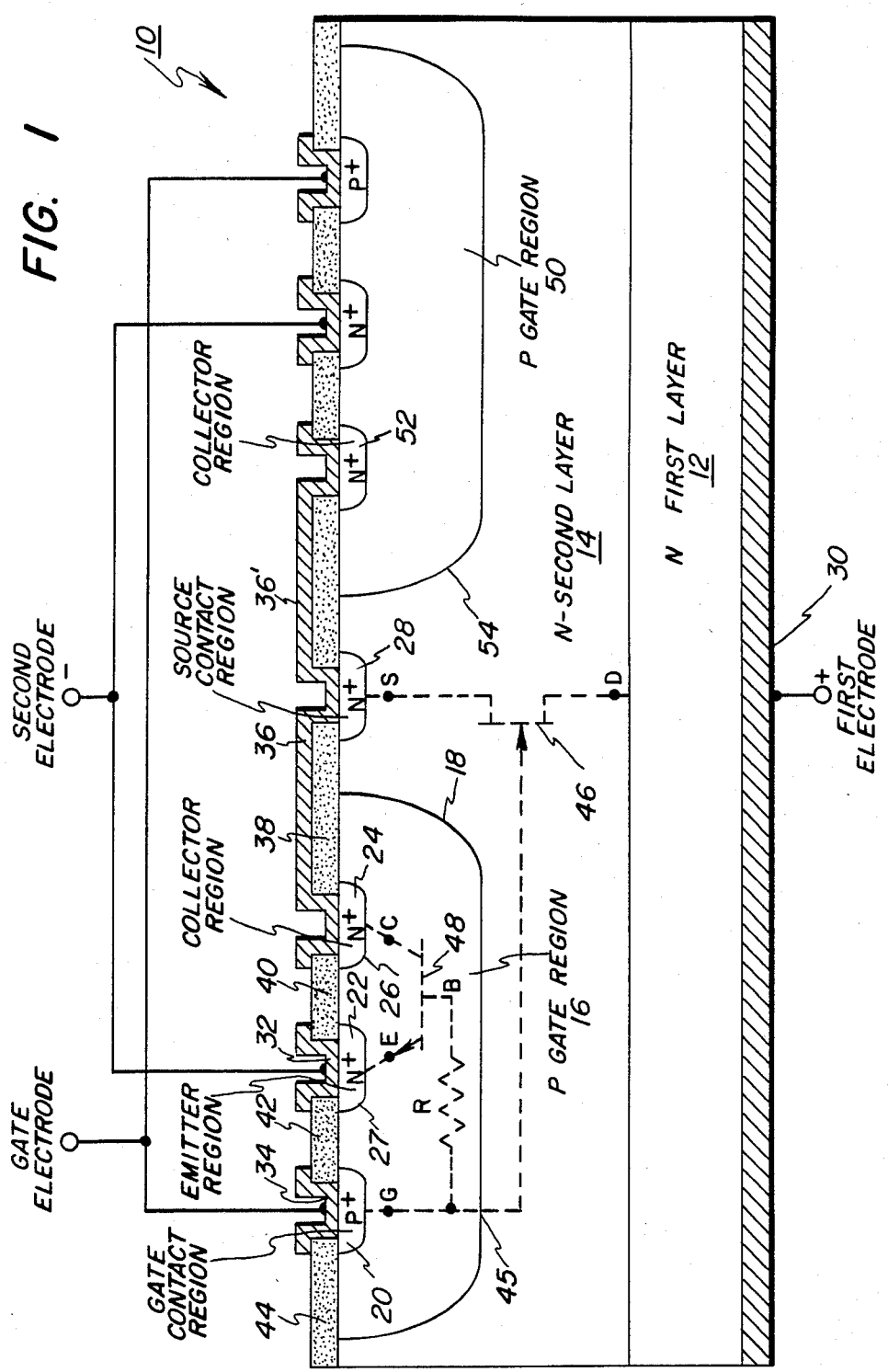

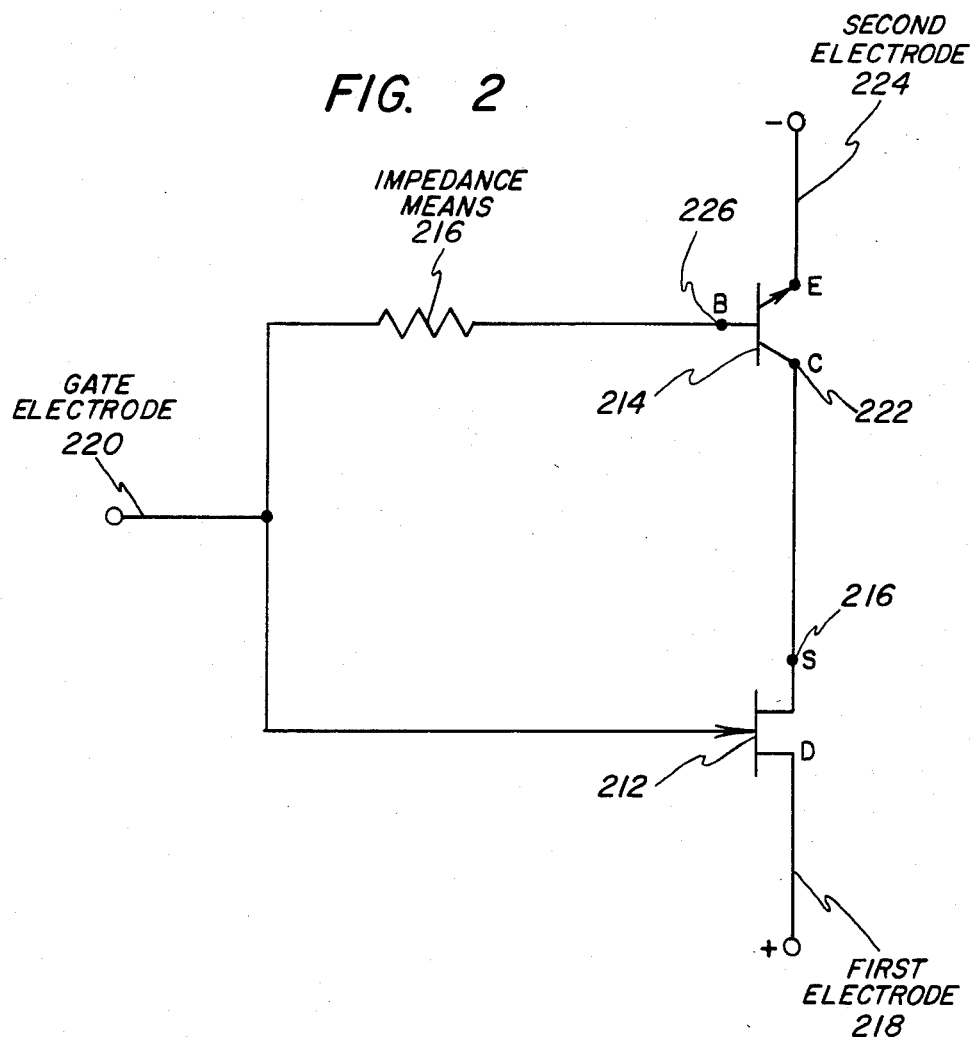

NORMALLY-OFF SEMICONDUCTOR DEVICE WITH LOW ON RESISTANCE AND CIRCUIT ANALOGUE

CROSS-REFERENCE TO RELATED APPLICATION

This application is related to copending U.S. patent application Ser. No. 257,080, filed Apr. 24, 1981 by B. J. Baliga (the present inventor) and M. S. Adler and assigned to the present assignee, the entire disclosure of which is incorporated herein by reference.

BACKGROUND OF THE INVENTION

The present invention relates to a normally-off semiconductor device with low on-resistance and to a circuit analog of such device.

A junction field-effect transistor (hereinafter designated JFET) of the N-channel type typically comprises a channel region of N-type semiconductor material and a P-type gate region adjoining the N-type channel region and forming a P-N junction therewith. Upon reverse biasing of this P-N junction through appropriate biasing of the P-type gate region, a depletion region is formed in the vicinity of the P-N junction and extends into the N-type channel region so as to shrink the portion of the channel that can conduct current. When the depletion region has spread across the entire channel, the JFET is in, what is known in the art as, a pinched-off condition in which it cannot conduct current.

A JFET is a normally-on device; that is, a JFET's gate region must be biased in order to pinch off the JFET. In many applications, however, it is desirable to have normally-off device operation. Such normally-off operation is achieved in an electrical circuit described and claimed in the abovereferenced application. In such circuit, a JFET is serially connected to a bipolar transistor, with the base electrode of the bipolar transistor serving as a gate or control electrode for the circuit. Normally-off operation of the JFET is achieved because the base electrode must be appropriately biasd to turn on the bipolar transistor and allow the JFET to conduct current.

In the foregoing electrical circuit, the gate of the JFET is electrically shorted to the emitter of the bipolar transistor, resulting in the P-N junction of the JFET being reverse-biased, at least to a slight extent, while the JFET is conducting current. As a consequence, the circuit cannot take advantage of a technique for markedly lowering the on-resistance of a JFET, which involves forward-biasing the P-N junction of the JFET. With the P-N junction sufficiently forward-biased, the P-type gate region injects holes into the N-type channel, resulting in a lowering of the channel resistance, and hence, lowering of the on-resistance of the JFET. By controlling the level of the biasing voltage on the JFET's gate, the extent of carrier injection into the N-type channel and, hence, the on-resistance of the JFET, is modulated. This technique is discussed in detail in an article by B. J. Baliga, entitled "Bipolar Operation of Power Junction Gas Field-Effect-Transistors", *Electron Letters,* Vol. 16 (1980), pages 300-301, which is incorporated herein by reference.

It would be desirable to provide a JFET that operates in a normally-off fashion, yet which achieves a markedly reduced on-resistance through forward-biasing of its P-N junction.

SUMMARY OF THE INVENTION

Accordingly, it is an object of my invention to provide a semiconductor device including a JFET that operates in a normally-off fashion with markedly reduced on-resistance through forward-biasing of its P-N junction.

A further object of my invention is to provide an electrical circuit including a JFET that operates in a normally-off fashion with reduced on-resistance, wherein the circuit advantageously requires only a single control signal.

Another object of my invention is to provide a semiconductor device of compact size, including a normally-off JFET with reduced on-resistance.

In accordance with the preferred embodiment of my invention, I provide a semiconductor device including an N-channel region, a P-gate region forming a P-N junction with the N-channel region, and a bipolar transistor for achieving normally-off operation. To achieve compactness, the bipolar transistor is formed integrally with the P-gate region and includes N+ (or highly-doped) emitter and collector regions adjoining the P-gate region. The P-gate region, in the vicinity of the emitter and collector regions, functions as the P-base region of the bipolar transistor. The portion of the P-gate region situated between the P-base region and a P+ gate contact region which adjoins the P-gate region provides electrical resistance between the P-base region and the P+ gate contact region. A single gate electrode adjoining the P+ gate contact region serves as a control electrode for the entire device. The collector region is ohmically connected to the source side of the N-channel region. The P-N junction between the P-gate region and the N-channel region is forward biased when the bipolar transistor is biased into conduction, so that the device on-resistance (i.e., JFET on-resistance plus bipolar transistor on-resistance) is low.

BRIEF DESCRIPTION OF THE DRAWINGS

The features of the invention believed to be novel and unobvious over the prior art are set forth with particularity in the appended claims. The invention itself, as to organization and method of operation, together with further objects and advantages thereof, may be best understood by reference to the following description considered in connection with the accompanying drawings, in which:

FIG. 1 is a schematic view in cross section of a cell of a semiconductor device in accordance with my invention with an explanatory circuit diagram shown in dashed lines; and FIG. 2 is a schematic diagram of a circuit analogue of the semiconductor device of FIG. 1.

DESCRIPTION OF THE PREFERRED EMBODIMENTS

There is illustrated in FIG. 1 a cross section of a preferred cell, or repeated structure, of a semiconductor device 10 in accordance with my invention. Only the left-hand side of the illustrated cell of device 10 is described in detail herein, inasmuch as the right-hand side thereof is preferably symmetrical to the left-hand side, as illustrated. Device 10 includes a first layer 12, which is highly-doped with N-type impurities, designated "N+" in the art, and preferably comprises a bulk substrate. Disposed atop substrate layer 12 is a second layer 14 lightly doped with N-type impurities, designated "N−", and preferably comprising an epitaxially grown layer. Adjoining the upper portion of the second layer 14 is gate region 16, doped with P-type impurities to a reference level, designated "P", and preferably formed by diffusion or ion implantation. A P-N junction 18 exists between P gate region 16 and N− second layer 14.

Adjoining the upper portion of P-gate region 16 are each of three regions: a P+ (or highly doped P-type) gate contact region 20, an N+ emitter region 22, and an N+ collector region 24. A P-N junction 26 exists between N+ collector region 24 and P gate region 16, and a further P-N junction 27 exists between N+ emitter region 22 and P gate region 16. N+ source contact region 28 also adjoins the upper portion of N− second layer 14.

Device 10 advantageously is a three-electrode device, comprising a first electrode 30 adjoining the underside of N+ substrate layer 12, a second electrode 32 adjoining N+ emitter region 22, and a gate electrode 34 adjoining P+ gate contact region 20. Additionally, an interconnection electrode 36 ohmically connects together N+ collector region 24 and N+ source contact region 28. Interconnection electrode 36 suitably comprises metallization adjoining both regions 24 and 28 and is preferably separated dielectrically from N− second layer 14 and P gate region 16 by an insulating layer 38, atop the device. Layer 38 suitably comprises, for example, silicon dioxide or silicon nitride. Further insulation layers 40, 42 and 44 respectively, perform similar dielectric separation functions between each of electrodes 36, 32 and 34 and P gate region 16. Insulation layers 38, 40, 42, and 44, formed in conventional fashion, additionally are useful as diffusion masks during the formation of the small regions at the upper portion of device 10: i.e., regions 20, 22, 24, and 28. The separation of the various electrodes on the upper surface of device 10, for example, 32 and 34, is suitable accomplished with photolithographic technique.

As illustrated in FIG. 1 in dashed lines, an inherent, N-channel junction field-effect transistor (JFET) 46 in device 10 is formed from N+ first layer 12, constituting a drain, designed D; N+ source contact region 28, constituting a source, designated S; and P gate region 16, constituting a gate, designated G. Also inherent in device 10 is an N-P-N bipolar transistor 48 formed from N+ collector region 24, designated C; N+ emitter region 22, designated E; and the portion of P gate region 16 in the vicinity of emitter and collector regions 22 and 24, respectively, designated B. Base B of transistor 48 is connected to gate G of JFET 46 via the inherent resistance R, existing between base B and P+ gate contact region 20, the value of which increases with increasing separation of base B from P+ gate contact region 20. No inherent resistance is shown between gate G and location 45 of P-N junction 18 directly beneath region 20, however, inasmuch as these points are extremely close together in a practical device, much more so than is illustrated in the schematic view of FIG. 1.

Semiconductor device 10 incorporates inherent JFET 46, inherent bipolar transistor 48, and inherent resistance R in a compact semiconductor device. In realizing the objective of a compact device 10, I prefer that N+ collector region 24 be interposed between N+ emitter region 22 and N+ source contact region 28. This arrangement simplifies the electrical interconnection of regions 24 and 28, which is accomplished by electrode 36. In this connection, device 10 can be simple of construction if a cell of semiconductor device 10 includes a second P gate region 50, adjoining the upper portion of N− second layer 14, with the right-hand side of device 10 including P gate region 50, as illustrated, being symmetrical to the illustrated left-hand side of device 10. This permits, for instance, an N+ collector region 52 adjoining P gate region 50 to be ohmically connected also to N+ source contact region 28, via an extension 36' of interconnection electrode 36.

In operation of semiconductor device 10, with gate electrode 34 shorted to second electrode 32, through a low resistance conductive path (not shown), device 10 cannot conduct "forward" current (that is, positive current from first electrode 30 to second electrode 32, with second electrode 32 more positive in potential than first electrode 30). Accordingly, device 10 operates in a normally-off fashion. This occurs because, with gate electrode 34 so shorted, P-N junction 18 is reverse biased and P-N junction 27 is shorted. Inasmuch as P-N junction 27 constitutes the base-to-emitter junction of bipolar transistor 48, this prevents such transistor from turning on and conducting current that would otherwise flow from N+ source contact region 28 to N+ collector region 24, via interconnection electrode 36.

With gate electrode 34 shorted to second electrode 32, however, device 10 can conduct "reverse" current (that is, positive current from second electrode 32 to first electrode 30, with second electrode 32 sufficiently more positive in potential than first electrode 30). This is because a current path then exists through device 10 from second electrode 32, through shorted gate electrode 34, P+ gate contact region 20, P gate region 16, P-N junction 18 (which is sufficiently forward biased), and N-type layers 14 and 12, to first electride 30. Accordingly, device 10 functions as a reverse-conducting diode when it conducts reverse current, permitting device 10 to be utilized in electrical circuits (not shown) requiring reverseconducting capability.

To prevent forward current conduction in device 10 when gate electrode 34 is shorted to second electrode 32, P-N junction 26 must be able to support the potential on N+ source contact region 28, which also exists on N+ collector region 24 due to the electrical short therebetween provided by interconnection electrode 36. Because P-N junction 26 constitutes the base-to-collector junction of inherent transistor 48, this means that transistor 48 must have a breakdown voltage that can support the potential on N+ source contact region 28. Transistor 48, however, need only comprise a low breakdown voltage transistor, which advantageously can be made with low saturated on-resistance, a high current gain, and a fast switching speed. This is because the potential of N+ source contact region 28 is limited to a low value when gate electrode 34 is shorted to second electrode 32. In this situation, with first electrode 30 biased more positively than second electrode 32, P-N junction 18 is reverse-biased and a depletion region (not illustrated) extends into N− second layer from P-N junction 18; similarly, a further depletion region (not illustrated) extends into N− second layer 14 from P-N junction 54, extant between P gate region 50 and N− second layer 14. These depletion regions merge together in the portion of N− second layer 14 beneath N+ source contact region 28, even at low levels of positive voltage on first electrode 30. Such merged depletion regions constitute a potential barrier between N+ first layer 12 and N+ source contact region 28, whereby the potential of N+ source contact region 28 remains low, (for example, below 50 volts), even when the potential of first electrode 30 is raised above 500 volts.

Semiconductor device 10 can conduct forward current when gate electrode 34 is biased with a positive voltage in excess of about 0.7 volts, at least for silicon devices. This sufficiently forward biased P-N junction 27, which constitutes the base-to-emitter junction of inherent, bipolar transistor 48, so as to turn on, transistor 48. The impedance value of inherent resistance R between P+ gate contact region 20 and P-N junction 26 is selected to insure turn-on of transistor 48 when gate electrode 34 is biased with a predetermined level of voltage. The positive bias voltage on gate electrode 34 additionally serves to forward bias P-N junction 18, whereby holes are injected from P gate region 16 into N− second layer 14. The presence of holes in N− layer 14 reduces the on-resistance of layer 14, the level of such on-resistance depending upon the level of bias voltage on gate electrode 34. For a 200-volt device, the on-resistance is reduced to about one-tenth that of a comparable device without hole injection into layer 14, and, for a 1000-volt device, the on-resistance is reduced to about one-hundredth that of a comparable device without hole injection into layer 14. Accordingly, device 10 attains an extremely low on-resistance in its forward conduction state.

Semiconductor device 10 can be turned off by shorting gate electrode 34 to second electrode 32. This removes the base drive of inherent bipolar transistor 48, thus turning off transistor 48 and terminating any current flow through device 10. The excess holes that are stored in N− second layer 14 cross over P-N junction 18 into P gate region 16, and are conducted via P+ gate contact region 20 to gate electrode 34 where they recombine with electrons therefrom. Excess electrons in N− second layer 14 are conducted via N+ first layer 12 to first electrode 30. Depletion regions (not shown) extending into N− second layer 14 from P-N junctions 18 and 54 enable device 10 to block current flow once the excess charge is removed from N− second layer 14. The speed of turn-off of device 10 is very fast, with a 600-volt device expected to have a turn-off time of about one microsecond. Moreover, if the gate electrode 34 is supplied with a negative bias voltage rather than being shorted to second electrode 32, a substantially reduced turn-off time for a 600-volt device of about 500 nanoseconds is expected.

Turning to FIG. 2, an electrical circuit 210 is illustrated, which constitutes a circuit analogue of semiconductor device 10 (FIG. 1), at least insofar as circuit 210 is of the normally-off type and achieves low on-resistance. Electrical circuit 210 includes a JFET 212 of the high voltage, N-channel type; a bipolar transistor 214 of the low voltage N-P-N type; and an impedance means 216, preferably a resistor. JFET 212 includes a source electrode 216, a drain electrode 218, and a gate electrode 220. Bipolar transistor 214 includes a collector electrode 222, an emitter electrode 224, and a base electrode 226.

The various elements of electrical circuit 210 are interconnected as follows. Source electrode 216 is ohmically interconnected with collector electrode 222. Impedance means 216 is electrically interposed between base electrode 226 and gate electrode 220. Electrical circuit 210 advantageously constitutes a three-electrode circuit, with drain electrode 218 serving as a first main current electrode, emitter electrode 224 serving as a second main current electrode, and gate electrode 220 serving as a gate electrode for the entire circuit 210.

The various elements of electrical circuit 210 may be provided in discrete form, or they may be individually formed in an integrated circuit, such as semiconductor device 10 of FIG. 1.

Shorting of gate electrode 220 to first electrode 218 by an appropriate means enables circuit 210 to block forward current (i.e., positive current from first electrode 218 to second electrode 224). Biasing of gate 220 with a positive voltage in excess of about 0.7 volts, at least for silicon devices 212 and 214, permits circuit 210 to conduct forward current with an extremely low on-resistance, inasmuch as the on-resistance of JFET 212 becomes reduced because its P-type gate region (not shown) inject holes into its N-type channel region (not shown).

In summary, I have provided a semiconductor device capable of switching large amounts of current with extremely low on-resistance, which is of the normally-off type, and which is arranged so as to attain a compact size. Additionally, I have provided an electrical circuit analogue of this semiconductor device, which similarly attains the advantages of large current switching capability with low on-resistance and normally off-operation.

While my invention has been described with respect to specific embodiments, many modifications and substitutions will be apparent to those skilled in the art. For example, a complementary semiconductor device could be made in which P-type material is used rather than N-type material, and vice-versa. Similarly, an electrical circuit analogue of the semiconductor device could be made in which complementary transistors are substituted; that is, a P-N-P bipolar transistor substituted for an N-P-N bipolar transistor, and a P-channel JFET substituted for a N-channel JFET. It is, therefore to be understood that the appended claims are intended to cover these and all such modifications and substitutions as fall within the true spirit and scope of the invention.

What I claim as my invention and desire to have secured by Letters Patent of the United States is:

1. A normally-off semiconductor device with low on-resistance comprising:

a first layer highly-doped to one conductivity type;

a first main current electrode adjoining the underside of said first layer;

a second layer of the one conductivity type disposed atop said first layer;

a gate region adjoining an upper portion of said second layer and being of a conductivity type opposite to that of said second layer;

a highly-doped gate contact region of the opposite conductivity type adjoining said gate region;

a gate electrode adjoining said gate contact region;

emitter and collector regions adjoining said gate region and being of the one conductivity type, said emitter and said collector regions being separated from said second layer by said gate region;

a second main current electrode adjoining said emitter region; and interconnection means ohmically connecting said collector region to said second layer, said interconnection means including a highly-doped source contact region of the one conductivity type adjoining said second layer.

2. The device of claim 1 wherein said emitter and collector regions are spacially interposed between said gate contact region and said source contact region.

3. The device of claim 2 wherein said collector region is spacially interposed between said emitter region and said source contact region.

4. The device of claim 2 further comprising:
a second gate region adjoining the upper portion of said second layer and being of the opposite conductivity type; and
a second collector region adjoining said second gate region and being of the one conductivity type;
said interconnection means ohmically connecting said second collector region to said source contact region.

5. The device of claim 1 wherein said gate region comprises a diffused region.

6. The device of claim 1 wherein said gate region comprises an ion-implanted region.

7. The device of claim 1 wherein said gate contact region, said source contact region, and said emitter and collector regions each comprises a diffused region.

8. The device of claim 5 wherein said gate contact region, said source contact region, and said emitter and collector regions each comprises an ion-implanted region.

9. The device of claim 1 wherein said first layer comprises a bulk substrate and said second layer comprises an epitaxial layer grown on said first layer.

10. The device of claim 9 wherein said first and second layers, said emitter and collector regions, and said source region each comprise semiconductor material of N-type conductivity, and said gate region and said gate contact region each comprises semiconductor material of P-type conductivity.

11. The semiconductor device of claim 10 wherein the semiconductor device comprises silicon.

* * * * *